United States Patent
Wakita

[11] Patent Number: 5,567,357
[45] Date of Patent: Oct. 22, 1996

[54] CONDUCTIVE PAINT HAVING GOOD ADHESION TO MOLDING OF METALLIC OXIDE

[75] Inventor: Shinichi Wakita, Osaka, Japan

[73] Assignee: Tatsuta Electric Wire & Cable Co., Ltd., Osaka, Japan

[21] Appl. No.: 424,427

[22] PCT Filed: Aug. 24, 1994

[86] PCT No.: PCT/JP94/01401

§ 371 Date: Apr. 21, 1995

§ 102(e) Date: Apr. 21, 1995

[87] PCT Pub. No.: WO95/06092

PCT Pub. Date: Mar. 2, 1995

[30] Foreign Application Priority Data

Aug. 25, 1993  [JP]  Japan ................................. 5-210568

[51] Int. Cl.$^6$ ........................................ H01B 1/16
[52] U.S. Cl. ................................ 252/514; 252/512
[58] Field of Search ...................... 252/514, 500, 252/512; 106/1.14, 1.13; 427/125

[56] References Cited

U.S. PATENT DOCUMENTS

| | | | |
|---|---|---|---|
| 4,387,115 | 6/1983 | Kitamura et al. | 427/58 |
| 5,242,511 | 9/1993 | Yokoyama et al. | 252/514 X |
| 5,372,749 | 12/1994 | Li et al. | 252/514 X |

FOREIGN PATENT DOCUMENTS

| | | |
|---|---|---|
| 53-135495 | 11/1978 | Japan . |
| 3-067402 | 3/1991 | Japan . |
| 4-077639 | 3/1992 | Japan . |
| 4-214773 | 8/1992 | Japan . |
| 5-028829 | 2/1993 | Japan . |
| 5-217422 | 8/1993 | Japan . |

Primary Examiner—Douglas J. McGinty
Attorney, Agent, or Firm—Wenderoth, Lind & Ponack

[57] ABSTRACT

A conductive paint having a good adhesion to a molding of metallic oxide comprises: 100 parts by weight of silver-plated copper powder containing silver plating in the amount of not more than 30 wt %; 13.6–6.0 parts by weight of phenolic resin (solid content); 0.2–0.7 part by weight of one selected from saturated fatty acids, unsaturated fatty acids, metallic salts thereof, and coupling agents containing saturated fatty acids or unsaturated fatty acids; 1.0–4.0 parts by weight of triethanolamine; and 0.1–1.0 part by weight of dihydroxybenzene. The phenolic resin is a resol phenolic resin having an infrared spectrum that satisfies the following relationships:

(A) $1/n = 0.8$–$1.2$
(B) $m/n = 0.8$–$1.2$
(C) $b/a = 0.8$–$1.2$
(D) $c/a = 1.2$–$1.5$ wherein 1, m, n, a, b and c are, respectively, infrared transmittances of 2-monosubstitution product, 2,4-disubstitution product, 2,4,6-trisubstitution product, methylol group, dimethylenether, and phenol group.

2 Claims, No Drawings

CONDUCTIVE PAINT HAVING GOOD ADHESION TO MOLDING OF METALLIC OXIDE

TECHNICAL FIELD

This invention relates to a conductive paint having a good adhesion to a molding of metallic oxide.

BACKGROUND ART

Moldings of metallic oxide, such as ITO (indium tin oxide) and IO (indium oxide), are widely used as transparent conductive films for electrodes in liquid crystal displays and solar batteries. In order to attach a lead to such a molding of metallic oxide, silver paste (paint in a paste form containing silver powder as main component) is generally used as a soldering electrode.

On the other hand, silver paste is not only expensive but usually contains epoxy resin as a binder in order to attain high adhesion to the molding of metallic oxide. Thus, good solderability and adhesion are achievable only if hardening conditions for the paste are controlled with high precision.

An object of this invention is to provide a conductive paint which satisfies the following requirements:
(1) good adhesion to a molding of metallic oxide such as ITO and IO;
(2) good solderability, especially in reflow soldering; and
(3) satisfying the requirements (1) and (2) in a wide range of hardening conditions.

DISCLOSURE OF THE INVENTION

In order to achieve the above object, according to the present invention, there is provided a conductive paint having a good adhesion to a molding of metallic oxide, the conductive paint comprising 100 parts by weight of silver-plated copper powder containing silver plating in the amount of not more than 30 wt %; 13.6–6.0 parts by weight of phenolic resin (solid content); 0.2–0.7 part by weight of one selected from saturated fatty acids, unsaturated fatty acids, metallic salts thereof and coupling agents containing saturated fatty acids or unsaturated fatty acids; 1.0–4.0 parts by weight of triethanolamine; and 0.1–1.0 part by weight of dihydroxybenzene, the phenolic resin being a resol phenolic resin which satisfies the following relations:
(A) $l/n = 0.8–1.2$
(B) $m/n = 0.8–1.2$
(C) $b/a = 0.8–1.2$
(D) $c/a = 1.2–1.5$
wherein $l$, $m$, $n$, $a$, $b$ and $c$ are infrared ray transmittances of 2-mono substitution product, 2, 4-di substitution product, 2, 4, 6- tri substitution product, methylol group, dimethylenether and phenol group, respectively.

The aforementioned conductive paint is made by adding an appropriate amount of antifoamer and a solvent comprising butylcarbitol and acetylacetone in the weight ratio of 9.5/0.5–8.0/2.0 and kneaded together.

The conductive paint according to the present invention satisfies all of the above-noted requirements.

If the amount of the silver plating in the silver-plated copper powder exceeds 30 wt %, silver in the paint will migrate into or be taken or eaten by the solder because silver quickly diffuses into the solder during soldering.

If the content of the phenolic resin as a binder exceeds 13.6 wt %, the solderability will not be good. On the other hand, if it is less than 6.0 wt %, the silver-plated copper powder will not bind satisfactorily and the adhesion will worsen. With the ratio of silver-plated copper powder to binder, as the amount of the binder decreases, the adhesion to molding of metallic oxide will increase for a moment. This is considered to be due to the fact that the heat history during the heat hardening process is released by the increase in the ratio of the silver-plated copper powder. As for the transmittances of the phenolic resin defined in (A) to (D), see Unexamined Japanese Patent Publication No. 2-16172.

Saturated fatty acid may be palmitic acid, stearic acid or arachic acid having a carbon number of 16–20; unsaturated fatty acid may be palmitoleic acid, oleic acid or linolenic acid having a carbon number of 16–18; metallic salt thereof may be salts combined with metal such as sodium, potassium, copper, aluminum or zinc. Coupling agents containing saturated fatty acid or unsaturated fatty acid may be isopropyl tristearoyl titanate, isopropyl trioctanol titanate or isopropyl dimethacryl isostearoyl titanate.

These dispersants are added for better dispersion of the silver-plated copper powder. But if it exceeds the upper limit, the adhesion of paint to ITO or IO will be poor. On the other hand, if it is below the lower limit, the dispersion will worsen, thereby lowering the solderability.

Triethanolamine is added to improve the adhesion of molding of metallic oxide to ITO or IO. Considering the solderability, 2.5 parts by weight of triethanolamine will be most appropriate. If its content exceeds the upper limit, the solderability will decrease. If it is below the lower limit, the adhesion to ITO or IO will be poor.

Dihydroxybenzene may be catechol, resorcinol or hydroquinone. It is added to improve the adhesion to ITO or IO and to keep silver paste from being taken or eaten by solder during reflow soldering. If more than 1.0 part by weight, the solderability will worsen. If less than 0.1 part by weight, the adhesion will decrease and it will become difficult to prevent the silver paste from being taken or eaten by the solder. Thus, its content should preferably be 0.1–1.0 part by weight.

Antifoamer may be acryl or silicon group and its content should be within 0.05–0.3 part by weight. If below the lower limit, foam will remain in the paste during screen-printing. If above the upper limit, the adhesion to ITO or IO will be lower.

As for solvent, the weight ratio of butylcarbitol to acetylacetone should preferably be between 9.5/0.5 and 8.0/2.0. The amount of solvent should be adjusted to keep the viscosity of the paste to such a level as to make screen-printing possible. If the acetylacetone ratio is below this range, the wettability with respect to ITO or IO will be poor during printing. If above it, the solvent will volatilize so quickly as to worsen the printability.

BEST MODE FOR CARRYING OUT THE PRESENT INVENTION

Example

First, materials of Articles 1–9 according to the present invention and Control Articles 10–17 having compositions in part by weight shown in Table 1 were prepared. Each of them was put in an appropriate container and weighed. They were then kneaded with a roll mill for 20 minutes into paste forms (conductive paints).

They were subjected to the following tests. The results are shown at the bottom of Table 1. In any of the tests, the hardening temperature was kept within the range of ± 20° C. of the standard hardening temperature for each paste.

Specific Resistance

Each paste was screen-printed with a 180-mesh Tetron screen on a glass epoxy substrate to an area 1 mm wide and 60 mm long. It was then heated and hardened in an air oven at 160° C. for 30 minutes. The resistance and thickness of the hardened paste 60 mm long were measured to determine the specific resistance.

Solderability

Each paste was applied on ITO on stainless steel foil on which ITO had been deposited, with a 180-mesh Tetron screen. It was heated and hardened in an air oven at 160° C. for 30 minutes. Solder cream was screen-printed on the thus hardened paste and it was subjected to reflow heating at 230° C. for 2 minutes. We checked the wettability of the solder cream with respect to a paste coating.
Criterion for Evaluation
⊚: 100% of area of the paste coating was uniformly wetted with solder.
○: Not less than 90% of the area was wetted with solder.
Δ: 30 to 90% of the area was wetted with solder.
X: Less than 30% of the area was wetted with solder.

Adhesion

Each paste was applied on ITO on stainless steel foil on which ITO had been deposited, with a 180-mesh Tetron screen. It was heated and hardened in an air oven at 160° C. for 30 minutes. The thus hardened paste coating 10 mm × 10 mm was cross-cut by the width of 1 mm to divide the coating into 100 sections. Then, cellophane tape was affixed to and peeled off the coating to determine the adhesion of the coating to ITO.
Criterion for Evaluation
⊚: No peeling or chipping observed in any of the 100 square sections.
○: No peeling but slight chipping observed in some of the 100 square sections.
Δ: 1–99 square sections peeled off.
X: All of the sections peeled off.

Pulling Strength

Each paste was applied on ITO on stainless steel foil on which ITO had been deposited, with a 180-mesh Tetron screen so that its area will be 3 mm diameter. It was heated and hardened in an air oven at 160° C. for 30 minutes. Solder cream was screen-printed on the thus hardened paste and subjected to reflow heating process in an air oven at 230° C. for 2 minutes. As a lead wire for the soldered paste, a 0.6-mm diameter tin-plated annealed copper wire was soldered on the paste. We checked how firmly the paste was bonded to the ITO film by pulling the lead.
Criterion for Evaluation
○: Bonded firmly. X: Peeled off easily.

Printability

Each paste was screen-printed 100 times with a 180-mesh Tetron screen on a glass epoxy substrate. We checked the printability.

Criterion for Evaluation
○: No change in viscosity of the paste was observed during printing.
X: The viscosity changed during printing, making it difficult to continue printing.

The materials used in all Articles according to the present invention and Control Articles are as follows.

Silver plated copper powder: containing 11 wt % of silver plating

Phenolic resin: made by Gunei Chemical Industry (Trade name: Regitop PL4348)

Titanium coupling agent 1: isopropyl tristearoyl titanate

Titanium coupling agent 2: isopropyl trioctanol titanate

As is apparent from the above results, all of the Articles according to the present invention attained good evaluation (which means that they can stand practical use in all the tests). However, the Control Articles had bad evaluation (which means that they are practically useless) in some of the tests. It is confirmed that all of the Articles according to the present invention are satisfactorily useful as conductive paints for moldings of metallic oxide.

Next, we compared silver plating amount (parts by weight) in silver-plated copper powder by using Articles 1 and 2 and Control Articles 3 and 4 shown in Table 2. First, each of them was put in an appropriate container and weighed. They were kneaded into paste with a roll mill for 20 minutes. We conducted for these pastes the same tests as the above-described tests (Specific Resistance), (Solderability), (Adhesion) and (Pulling Strength) under the same conditions and also a test on how much the paste is eaten by the solder. The results are shown in Table 2. In the last-mentioned test, we visually checked whether the paste was taken or eaten by the solder during the solderability test after the reflow heating process. ○: shows that it was not taken or eaten in this test, whereas shows that it was eaten.

In all of the above tests, all of the Articles according to the present invention attained good evaluation (practically usable). However, the Control Articles had bad evaluation (practically useless) in tests for pulling strength and in the last-mentioned test. It is confirmed that the Articles according to the present invention are satisfactorily useful as conductive paints for moldings of metallic oxide.

Industrial Application

According to the present invention, the present invention can eliminate the necessity to control the hardening condition with high precision in the silver paste containing an epoxy resin binder, for good adhesion and solderability. Also, even if the hardening temperature varies within the range of ± 20° C. of the standard hardening temperature, it is possible to obtain good conductivity, adhesion and solderability. Thus, productivity will be improved markedly.

TABLE 1

| | Article according to the present invention | | | | | | | | |
|---|---|---|---|---|---|---|---|---|---|
| | 1 | 2 | 3 | 4 | 5 | 6 | 7 | 8 | 9 |
| Silver-plated copper powder | 100 | 100 | 100 | 100 | 100 | 100 | 100 | 100 | 100 |
| Phenolic resin | 13.5 | 6.5 | 11.1 | 11.1 | 11.1 | 11.1 | 11.1 | 11.1 | 11.1 |
| Titanium coupling agent 1 | 0.5 | 0.5 | | 0.7 | | | | 0.5 | 0.5 |
| Titanium coupling agent 2 | | | 0.3 | | 0.5 | | 0.5 | | |
| Oleinic acid potassium | | | | | | 0.5 | | | |
| Triethanoleamine | 2.5 | 2.5 | 2.5 | 2.5 | 1.5 | 3.5 | 2.5 | 2.5 | 2.5 |
| Catechol | 0.25 | 0.25 | | | 0.25 | 0.25 | | | |
| Hydroquinone | | | 0.25 | 0.25 | | | 0.15 | 0.90 | 0.25 |
| Antifoamer | 0.06 | 0.06 | 0.06 | 0.06 | 0.06 | 0.06 | 0.06 | 0.06 | 0.06 |
| Solvent butylcarbitol/acetylacetone | 9/1 | 9/1 | 9/1 | 9/1 | 9/1 | 9/1 | 9/1 | 9/1 | 8/2 |
| Specific resistance ($\times 10^{-4}$ Ω cm) | 2.0 | 1.3 | 2.2 | 1.8 | 1.5 | 1.7 | 1.9 | 1.5 | 2.0 |
| Solderability | ○ | ⊙ | ⊙ | ⊙ | ⊙ | ⊙ | ⊙ | ○ | ⊙ |
| Adhesion | ○ | ⊙ | ⊙ | ○ | ○ | ⊙ | ○ | ⊙ | ⊙ |
| Pulling strength | ○ | ○ | ○ | ○ | ○ | ○ | ○ | ○ | ○ |
| Printability | ○ | ○ | ○ | ○ | ○ | ○ | ○ | ○ | ○ |

| | Control article | | | | | | | |
|---|---|---|---|---|---|---|---|---|
| | 10 | 11 | 12 | 13 | 14 | 15 | 16 | 17 |
| Silver-plated copper powder | 100 | 100 | 100 | 100 | 100 | 100 | 100 | 100 |
| Phenolic resin | 14.0 | 5.0 | 11.1 | 11.1 | 11.1 | 11.1 | 11.1 | 11.1 |
| Titanium coupling agent 1 | 0.5 | | | 0.8 | 0.5 | 0.5 | | |
| Titanium coupling agent 2 | | 0.5 | 0.1 | | | | 0.5 | |
| Oleinic acid potassium | | | | | | | | 0.5 |
| Triethanoleamine | 2.5 | 2.5 | 2.5 | 2.5 | 5.0 | 0.5 | 2.5 | 2.5 |
| Catechol | 0.25 | 0.25 | | | 0.25 | 0.25 | | |
| Hydroquinone | | | 0.25 | 0.25 | | | 2.0 | 0.05 |
| Antifoamer | 0.06 | 0.06 | 0.06 | 0.06 | 0.06 | 0.06 | 0.06 | 0.06 |
| Solvent butylcarbitol/acetylacetone | 9/1 | 9/1 | 9/1 | 9/1 | 7/3 | 9/1 | 9/1 | 7/3 |
| Specific resistance ($\times 10^{-4}$ Ω cm) | 2.2 | 1.8 | 1.6 | 1.5 | 1.3 | 1.8 | 1.4 | 1.5 |
| Solderability | Δ | Δ | X | ⊙ | X | ⊙ | X | ⊙ |
| Adhesion | X | ○ | ⊙ | X | ⊙ | X | ⊙ | X |
| Pulling strength | X | X | X | X | X | X | X | X |
| Printability | ○ | ○ | ○ | ○ | ○ | ○ | ○ | ○ |

TABLE 2

| | Article according to the present invention | | Control article | |
|---|---|---|---|---|
| | 1 | 2 | 3 | 4 |
| 11% (silver plating) | 100 | | | |
| 25% (silver plating) | | 100 | | |
| 2% (silver plating) | | | 100 | |
| 35% (silver plating) | | | | 100 |
| Specific resistance ($\times 10^{-4}$ Ωcm) | 2.0 | 1.6 | 2.2 | 1.4 |
| Solderability | ⊙ | ⊙ | ⊙ | ○ |
| Adhesion | ⊙ | ⊙ | ⊙ | ⊙ |
| Pulling Strength | ○ | ○ | X | X |
| Paste eaten condition | ○ | ○ | ○ | X |

The compositions of the articles are the same as Article 9 in Table 1 except for the silver-plated copper powder.

What is claimed is:

1. A conductive paint having a good adhesion to a molding of metallic oxide, said conductive paint comprising 100 parts by weight of silver-plated copper powder containing silver plating in the amount of not more than 30 wt %; 13.6–6.0 parts by weight of phenolic resin (solid content); 0.2–0.7 part by weight of one selected from saturated fatty acids, unsaturated fatty acids, metallic salts thereof, and coupling agents containing saturated fatty acids or unsaturated fatty acids; 1.0–4.0 parts by weight of triethanolamine; and 0.1–1.0 part by weight of dihydroxybenzene, said phenolic resin being a resol phenolic resin which satisfies the following relations:

(A) 1/n=0.8–1.2

(B) m/n=0.8–1.2

(C) b/a=0.8–1.2

(D) c/a=1.2–1.5 wherein 1, m, n, a, b and c are infrared ray transmittances of 2-mono substitution product, 2, 4-di substitution product, 2,4, 6-tri substitution product, methylol group, dimethylenether and phenol group, respectively.

2. A conductive paint having a good adhesion to a molding of metallic oxide, wherein an effective amount of antifoamer and a solvent comprising butylcarbitol and acetylacetone in the weight ratio of 9.5/0.5–8.0/2.0 is added to and kneaded with said conductive paint claimed in claim 1.

* * * * *